United States Patent
Manabe et al.

(10) Patent No.: US 10,669,624 B2
(45) Date of Patent: Jun. 2, 2020

(54) SLIDING MEMBER AND METHOD FOR PRODUCING THE SAME

(71) Applicants: Kazuyoshi Manabe, Toyota (JP); Noritsugu Umehara, Nagoya (JP); Hiroyuki Kousaka, Nagoya (JP); Kazuyuki Ichimura, Nagoya (JP)

(72) Inventors: Kazuyoshi Manabe, Toyota (JP); Noritsugu Umehara, Nagoya (JP); Hiroyuki Kousaka, Nagoya (JP); Kazuyuki Ichimura, Nagoya (JP)

(73) Assignees: TOYOTA JIDOSHA KABUSHIKI KAISHA, Toyota-shi, Aichi-ken (JP); NATIONAL UNIVERSITY CORPORATION NAGOYA UNIVERSITY, Nagoya-shi, Aichi (JP)

( * ) Notice: Subject to any disclaimer, the term of this patent is extended or adjusted under 35 U.S.C. 154(b) by 190 days.

(21) Appl. No.: 15/715,416

(22) Filed: Sep. 26, 2017

(65) Prior Publication Data

US 2018/0087151 A1  Mar. 29, 2018

(30) Foreign Application Priority Data

Sep. 28, 2016  (JP) ................. 2016-190212

(51) Int. Cl.
*C23C 16/34* (2006.01)
*C23C 14/54* (2006.01)
(Continued)

(52) U.S. Cl.
CPC ......... *C23C 16/347* (2013.01); *C10M 103/02* (2013.01); *C10M 177/00* (2013.01);
(Continued)

(58) Field of Classification Search
USPC .......... 428/408, 698, 704; 427/577
See application file for complete search history.

(56) References Cited

U.S. PATENT DOCUMENTS 5,110,679 A * 5/1992 Haller ................ C23C 14/0658
428/698
5,837,357 A * 11/1998 Matsuo .................... G11B 5/72
428/408

(Continued)

FOREIGN PATENT DOCUMENTS

JP  2008-229780   * 10/2008
JP  2009-13370 A    1/2009
(Continued)

OTHER PUBLICATIONS

Cheng et al "Raman spectroscopy of carbon nitride films deposited using the filtered cathodic vacuum-arc technique combined with aradio-frequency nitrogen-ion beam" Appl. Phys. A 73, p. 341-345. (Year: 2001).*

(Continued)

*Primary Examiner* — Archene A Turner
(74) *Attorney, Agent, or Firm* — Sughrue Mion, PLLC (57) ABSTRACT

In an amorphous carbon film of a sliding member, provided that a number of nitrogen atoms each singly bonded to three carbon atoms is A, and a number of nitrogen atoms each singly and doubly bonded to two carbon atoms, respectively, is B, a value A/B of the amorphous carbon film obtained through X-ray photoelectron spectroscopy analysis is 10 to 18. The method includes irradiating the surface of the substrate with nitrogen ion beams and irradiating a carbon target with electron beams, thereby forming an amorphous carbon film on the surface of the substrate while vapor-depositing a part of the carbon target onto the surface of the substrate. The output of the electron beams that irradiate the carbon target is 30 to 50 W.

2 Claims, 11 Drawing Sheets

(51) Int. Cl.
    *C23C 14/06*     (2006.01)
    *C10M 177/00*     (2006.01)
    *C23C 14/02*     (2006.01)
    *C23C 14/00*     (2006.01)
    *C10M 103/02*     (2006.01)
    *C10M 141/06*     (2006.01)
    *C23C 14/46*     (2006.01)

(52) U.S. Cl.
    CPC ........ *C23C 14/0031* (2013.01); *C23C 14/024* (2013.01); *C23C 14/025* (2013.01); *C23C 14/0605* (2013.01); *C23C 14/0658* (2013.01); *C23C 14/541* (2013.01); *C10M 141/06* (2013.01); *C10N 2230/06* (2013.01); *C10N 2250/08* (2013.01); *C10N 2260/09* (2013.01); *C10N 2280/00* (2013.01); *C23C 14/46* (2013.01); *F05C 2203/0808* (2013.01)

(56) References Cited

U.S. PATENT DOCUMENTS

| | | | | |
|---|---|---|---|---|
| 5,840,435 A * | 11/1998 | Lieber | ................. | C01B 21/0605 428/698 |
| 5,843,571 A * | 12/1998 | Sho | ................. | C23C 16/26 428/704 |
| 6,706,363 B2 * | 3/2004 | Honda | ................. | G11B 5/72 428/408 |
| 6,844,068 B1 * | 1/2005 | Miyake | ................. | F01L 1/143 428/408 |
| 7,563,509 B2 * | 7/2009 | Chen | ................. | C23C 14/027 428/698 |
| 2011/0143976 A1 * | 6/2011 | Ito | ................. | C23C 14/0036 508/109 |

FOREIGN PATENT DOCUMENTS

| | | | |
|---|---|---|---|
| JP | 2012-003247 | * | 1/2012 |
| JP | 2013-57093 A | | 3/2013 |

OTHER PUBLICATIONS

Zhou et al "friction and wear property of a-CN(x) coatings sliding against Si(3)N(4) balls in water" Wear 263 p. 1253-1258. (Year: 2007).*

* cited by examiner

SLIDING MEMBER AND METHOD FOR PRODUCING THE SAME

CROSS REFERENCE TO RELATED APPLICATIONS

The present application claims priority from Japanese patent application JP 2016-190212 filed on Sep. 28, 2016, the content of which is hereby incorporated by reference into this application.

BACKGROUND

Technical Field

The present disclosure relates to a sliding member having a substrate and an amorphous carbon film formed on the surface of the substrate, and a method for producing the same.

Background Art

Conventionally, tribology has played an important role in the key industries in Japan, such as the automotive industry. For example, in the automotive industry, a variety of efforts have been made to reduce the amount of carbon dioxide emitted from automobiles for protecting the global environment. For example, development of power sources with high energy efficiency, such as hybrid systems, is known well. However, in order to further increase the fuel efficiency, it is important to not only develop power sources but also reduce an energy transmission loss due to friction that may occur inside an engine or in a drive system.

In view of the foregoing, an amorphous carbon material (DLC) is drawing attention as a new tribological material that covers a sliding surface of a sliding member, which is made of structural steel or high-alloy steel, in order to reduce the coefficient of friction of a sliding member in a power system and thus increase the wear resistance thereof.

As an example of a method for producing a sliding member using such an amorphous carbon material, Patent Document 1 proposes a method for producing a sliding member that includes forming an amorphous carbon film containing nitrogen atoms on the surface of a substrate. Specifically, the production method includes irradiating the surface of a substrate with nitrogen ion beams and irradiating a carbon target with electron beams so that a plurality of protrusions are formed on the surface of the amorphous carbon film to be formed, thereby forming the amorphous carbon film while vapor-depositing carbon particles evaporated from the carbon target onto the surface of the substrate.

Accordingly, a plurality of protrusions are formed on the surface of the obtained amorphous carbon film of the sliding member, and such protrusions are softer than the other portions of the surface of the amorphous carbon film. As described above, providing soft protrusions on the surface of the amorphous carbon film can improve the friction characteristics of the sliding member in a non-lubricated state.

RELATED ART DOCUMENTS

Patent Documents

Patent Document 1: JP 2013-57093 A

SUMMARY

However, according to the sliding member disclosed in Patent Document 1, although the coefficient of friction can be reduced without the amorphous carbon film peeled off when the sliding member is slid in a non-lubricated state in the air, it may be impossible in some cases to sufficiently reduce the coefficient of friction under an environment in which the sliding member is slid with lubricating oil.

The present disclosure has been made in view of the foregoing problem, and the present disclosure provides a sliding member that can ensure a lower coefficient of friction than those of the conventional sliding members under an environment in which the sliding member is slid with lubricating oil, and a method for producing the same.

In view of the foregoing, the inventors have conducted concentrated studies and found the following. Specifically, when nitrogen atoms are contained in an amorphous carbon film, the amorphous carbon film contains both nitrogen atoms whose coordination number with carbon atoms is 2 (that is, nitrogen atoms that are singly bonded and doubly bonded to carbon atoms), and nitrogen atoms whose coordination number (bonding number) with carbon atoms is 3 (that is, nitrogen atoms that are singly bonded to carbon atoms). Herein, the distance between graphene layers each containing nitrogen atoms with coordination number (bonding number) of 3 is greater than the distance between graphene layers not containing nitrogen atoms. Accordingly, it is considered that such an amorphous carbon film has low shear properties under an environment in which lubricating oil is used.

Herein, in the background art described in Patent Document 1 and the like, for example, a carbon target is irradiated with electron beams with an output power of about several hundred watts in order to improve the adhesion property of the amorphous carbon film with respect to the substrate, improve the hardness of the amorphous carbon film and form protrusions. Herein, if the energy of electron beams that irradiate the carbon target is high, the possibility of double bond formation between nitrogen atoms and carbon atoms is likely to increase, and thus the proportion of nitrogen atoms whose coordination number with carbon atoms is 2 will increase.

Nitrogen atoms whose coordination number with carbon atoms is 2 are located at an end of a graphene due to their structures. Therefore, the inventors considered that if the number of such nitrogen atoms is large, they could divide the graphene into smaller pieces and thus are likely to generate smaller graphenes. The inventors also considered that the resulting graphenes would lose their inherent low shear properties.

Therefore, the inventors considered that it is important to limit the proportion nitrogen atoms whose coordination number with carbon atoms is 2 while securing a given proportion of nitrogen atoms whose coordination number with carbon atoms, which are adapted to be bonded to the nitrogen atoms in the amorphous carbon film, is 3.

The present disclosure is based on such new finding, and a sliding member in accordance with the present disclosure is a sliding member adapted to be slid with lubricating oil and having a substrate and an amorphous carbon film formed on the surface of the substrate, the amorphous carbon film containing nitrogen atoms. Provided that the number of nitrogen atoms each singly bonded to three carbon atoms is A and the number of nitrogen atoms each singly and doubly bonded to two carbon atoms, respectively, is B, the value A/B of the amorphous carbon film obtained through X-ray photoelectron spectroscopy analysis is greater than or equal to 10 and less than or equal to 18.

A method for producing a sliding member in accordance with the present disclosure is a method for producing a sliding member adapted to be slid with lubricating oil, the sliding member having a substrate and an amorphous carbon film formed on the surface of the substrate, the amorphous carbon film containing nitrogen atoms, the method including irradiating the surface of the substrate with nitrogen ion beams and irradiating a carbon target with electron beams, thereby forming the amorphous carbon film on the surface of the substrate while vapor-depositing a part of the carbon target onto the surface of the substrate. The output of the electron beams that irradiate the carbon target is greater than or equal to 30 W and less than or equal to 50 W.

According to the present disclosure, a lower coefficient of friction than those of the conventional sliding members can be ensured under an environment in which lubricating oil is used.

DETAILED DESCRIPTION

Hereinafter, embodiments of a sliding member and a production method therefor of the present disclosure will be described.

1. Regarding Method for Producing Sliding Member

Figure 1:
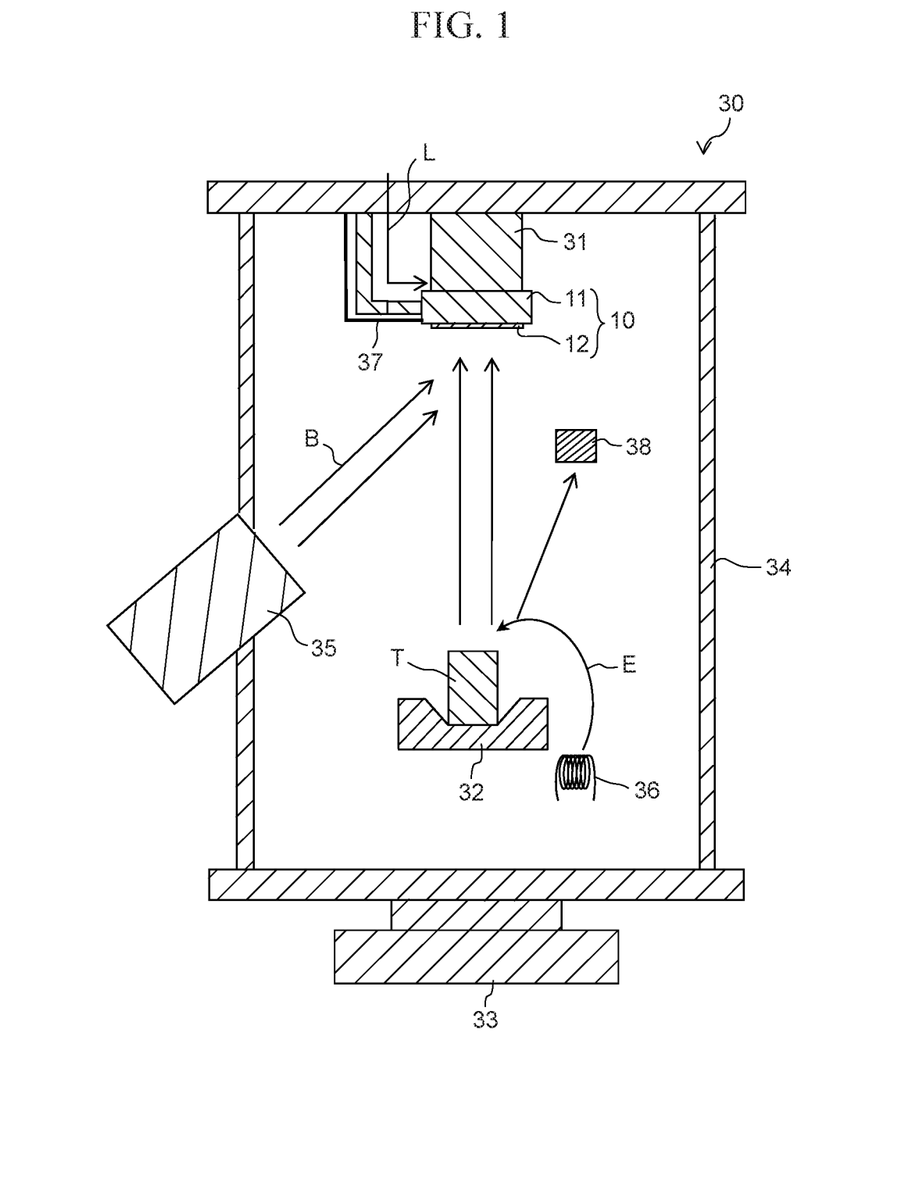
FIG. 1 is a schematic view of an apparatus configuration for producing a sliding member (forming a film on a substrate) in accordance with an embodiment.

FIG. 1 is a schematic view of an apparatus configuration for producing a sliding member (forming a film on a substrate) in this embodiment.

The method for producing a sliding member 10 in this embodiment is a method for producing the sliding member 10 that has a substrate 11 and an amorphous carbon film 12, which contains nitrogen atoms (amorphous carbon nitride film: $CN_x$ film), formed on the surface (sliding surface) of the substrate 11. Specifically, in this method, the surface of the substrate 11 is irradiated with nitrogen ion beams B, and a carbon target T is irradiated with electron beams E, thereby forming the amorphous carbon film 12 while vapor-depositing a part of the carbon target T onto the surface of the substrate 11. In this manner, the amorphous carbon film 12 can be formed using a dynamic mixing method that mixes carbon atoms and nitrogen atoms. Hereinafter, the method for producing the sliding member 10 will be specifically described.

First, the substrate 11 of the sliding member 10 is prepared. The material of the substrate 11 is not particularly limited as long as it has a quality and surface hardness that can ensure the adhesion property with respect to the amorphous carbon film 12 during sliding. Exemplary materials include steel, cast iron, aluminum, polymer resin, and silicon.

Before the amorphous carbon film 12 is formed on the surface of the substrate 11, an intermediate layer made of silicon (Si) may be also provided on the surface of the substrate 11 in order to increase the adhesion between the substrate 11 and the amorphous carbon film 12. Further, chromium (Cr), titanium (Ti), or tungsten (W) may be used instead of silicon.

The amorphous carbon film 12 containing nitrogen atoms is thrilled on the surface of the substrate 11 by combining ion beam mixing and electron beam vapor deposition using a vapor deposition apparatus 30 (IBAD (ion beam assisted deposition) apparatus) such as the one shown in FIG. 1. Specifically, as shown in FIG. 1, the substrate 11 is first placed on a pedestal 31, and a carbon target T is placed in a crucible 32 for electron beam irradiation.

Next, the pressure in a chamber 34 is reduced using a turbo-molecular pump 33. Specifically, the turbo-molecular pump 33 evacuates the air in the chamber 34 to put the chamber 34 in a state close to a vacuum (less than or equal to $2.0 \times 10^{-3}$ Pa). A rotary pump or a diffusion pump may also be used instead of the turbo-molecular pump 33, or the turbo-molecular pump 33 may be used in combination with such pump. In this embodiment, the air in the vacuum chamber is evacuated using the turbo-molecular pump 33 that does not use oil in order to eliminate the influence of oil to be adsorbed because a friction experiment described is performed.

Next, the substrate 11 is cooled indirectly with cooling water L, and also, the substrate 11 is irradiated with nitrogen ion beams B from a nitrogen ion beam generation source 35. Herein, the nitrogen ion beam generation source 35 is a commonly known apparatus for generating nitrogen ion beams. Specifically, nitrogen gas is introduced in the apparatus at a rate of 10 to 20 sccm. A microwave of 0.4 to 0.8 kW is introduced into the introduced nitrogen gas using a sputtering ion pump (not shown), thereby generating nitrogen gas plasma. The generated nitrogen gas plasma is accelerated at an accelerating voltage of 1.0 kV and is caused to irradiate the surface of the substrate 11 as the nitrogen ion beams B.

In this embodiment, first, the substrate 11 before film deposition is irradiated with the nitrogen ion beams B for about 10 minutes so that the surface of the substrate 11 is cleaned. It should be noted that cleaning may be omitted if the surface of the substrate 11 is cleaned in advance.

Next, the surface of the substrate 11 is irradiated with the nitrogen ion beams B, and also, the carbon target T is melted and evaporated (that is, sublimated) through irradiation with the electron beams E. Specifically, the carbon target T in the crucible 32 is irradiated with the electron beams E from the electron beam generation source 36 under the output condition of greater than or equal to 30 W and less than or equal to 50 W, whereby the carbon target T is heated to greater than or equal to 3000° C. Accordingly, carbon of the carbon target T is sublimated so that the carbon atoms are vapor-deposited onto the surface of the substrate 11.

The amorphous carbon film 12 is formed through the irradiation of the surface of the substrate 11 with the nitrogen ion beams B and also through vapor-deposition of carbon of the carbon target T onto the surface of the substrate 11. Therefore, the amorphous carbon film ($CN_x$ film) 12 contains nitrogen atoms. Although the deposition rate of the amorphous carbon film 12 becomes slower due to the effect of sputtering of the nitrogen ion beam, the amorphous carbon film 12 can be formed at a deposition rate of about 0.5 to 2.5 nm/s.

Herein, the thickness of the amorphous carbon film 12 is preferably in the range of 0.1 to 1.0 μm, and the amorphous carbon film 12 is preferably deposited to satisfy such a range. In addition, the content (atom %) of nitrogen atoms in the amorphous carbon film 12 is not particularly limited, but is preferably in the range of 1 to 15 atom %, and the amorphous carbon film 12 is preferably deposited to satisfy such a range. It should be noted that the content of nitrogen atoms in the amorphous carbon film 12 can be adjusted through the control of the microwave frequency, the accelerating voltage, and the like of the nitrogen ion beam generation source 35.

A thermocouple 37 shown in FIG. 1 is a measuring instrument for forecasting the temperature of the surface of the substrate 11 during film deposition. With the thermocouple 37, the temperature of the front surface or the rear surface of the substrate 11 is measured. In addition, a film thickness meter 38 is a quartz oscillator film thickness monitor for measuring the thickness of the amorphous carbon film 12 deposited. With the film thickness meter 38, the thickness of the amorphous carbon film 12 that increases with the passage of the deposition time is measured. In this embodiment, the intensity of the electron beams E from the electron beam generation source 36 is controlled within the intensity range described below on the basis of the thickness of the amorphous carbon film 12 measured with the film thickness meter 38 so that the deposition rate of the amorphous carbon film 12 can be controlled.

Figure 2A:
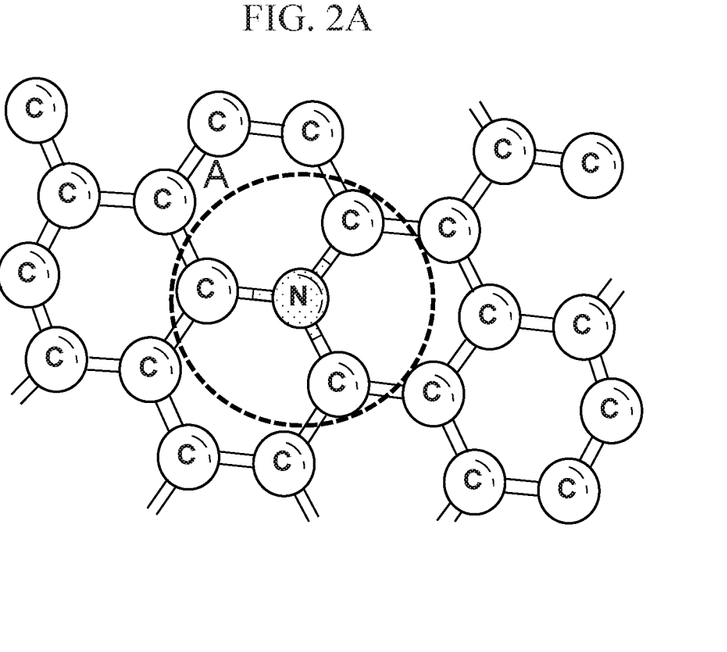
FIG. 2A is a schematic view showing a graphene of an amorphous carbon film, specifically, a state in which the graphene contains a nitrogen atom with coordination number of 3.
Figure 2B:
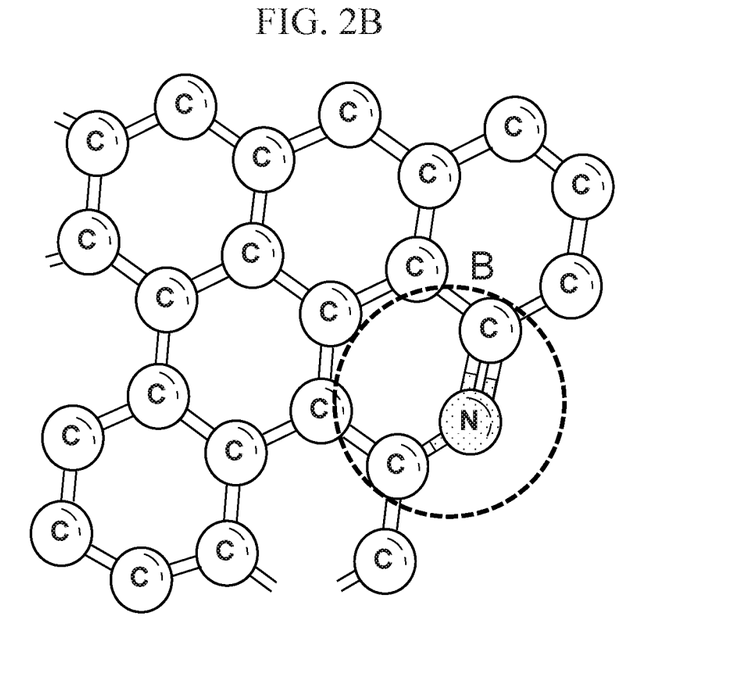
FIG. 2B is a schematic view showing a graphene of an amorphous carbon film, specifically, a state in which the graphene contains a nitrogen atom with coordination number of 2.

FIGS. 2A and 2B each show a graphene of the amorphous carbon film 12. FIG. 2A shows a state in which the graphene contains a nitrogen atom whose coordination number with carbon atoms is 3. Meanwhile, FIG. 2B shows a state in which the graphene contains a nitrogen atom whose coordination number with carbon atoms is 2.

In this embodiment, the amorphous carbon film 12 contains both a nitrogen atom (N) whose coordination number with carbon atoms (C) is 3 as shown in a part A of FIG. 2A, and a nitrogen atom (N) whose coordination number with carbon atoms (C) is 2 as shown in a part B of FIG. 2B. Hereinafter, a nitrogen atom (N) whose coordination number with carbon atoms (C) is 3 will be referred to as a nitrogen atom with coordination number of 3, and a nitrogen atom (N) whose coordination number with carbon atoms (C) is 2 will be referred to as a nitrogen atom with coordination number of 2. The nitrogen atom (N) with coordination number of 3 shown in FIG. 2A is singly bonded to each of three carbon atoms (C). Meanwhile, a nitrogen atom (N) with coordination number of 2 shown in FIG. 2B is singly bonded to one carbon atom (C) and is doubly bonded to another carbon atom (C).

Figure 3A:
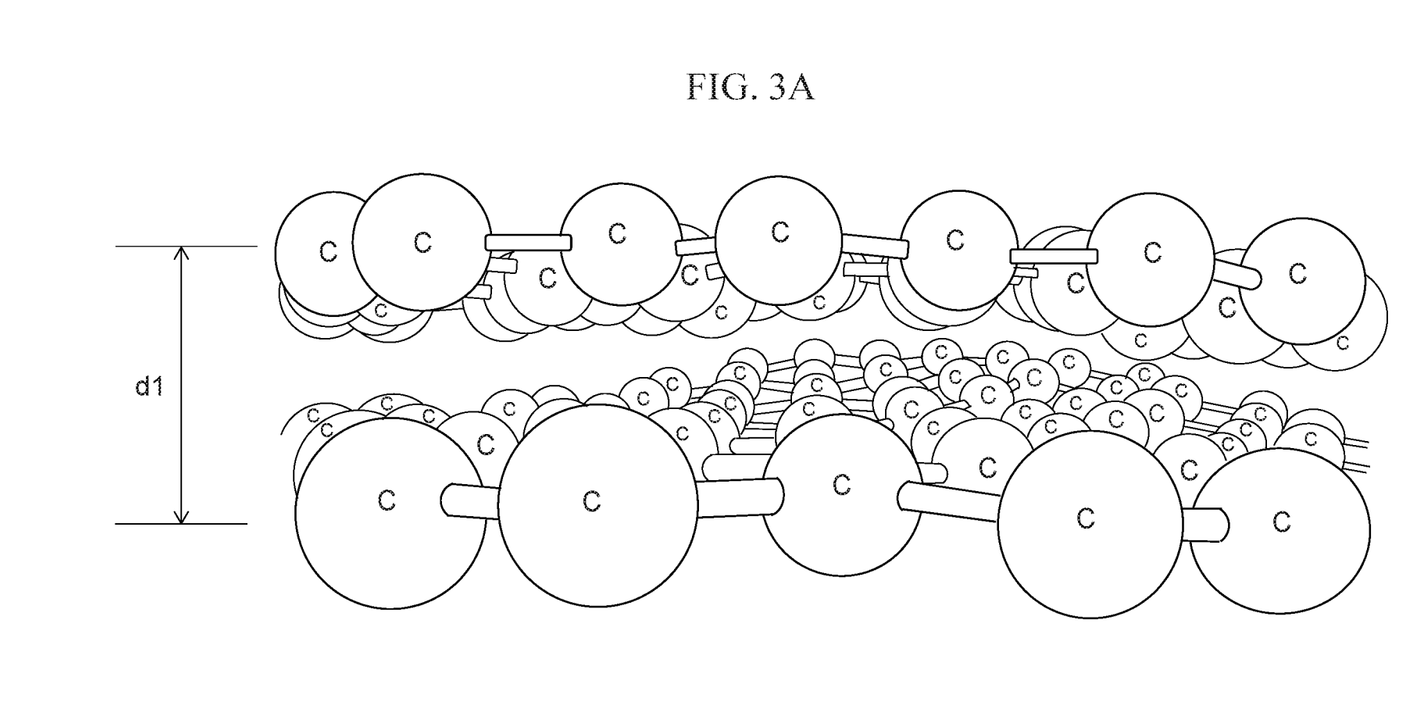
FIG. 3A is a schematic view showing the structures of adjacent graphemes in an amorphous carbon film not containing nitrogen atoms.
Figure 3B:
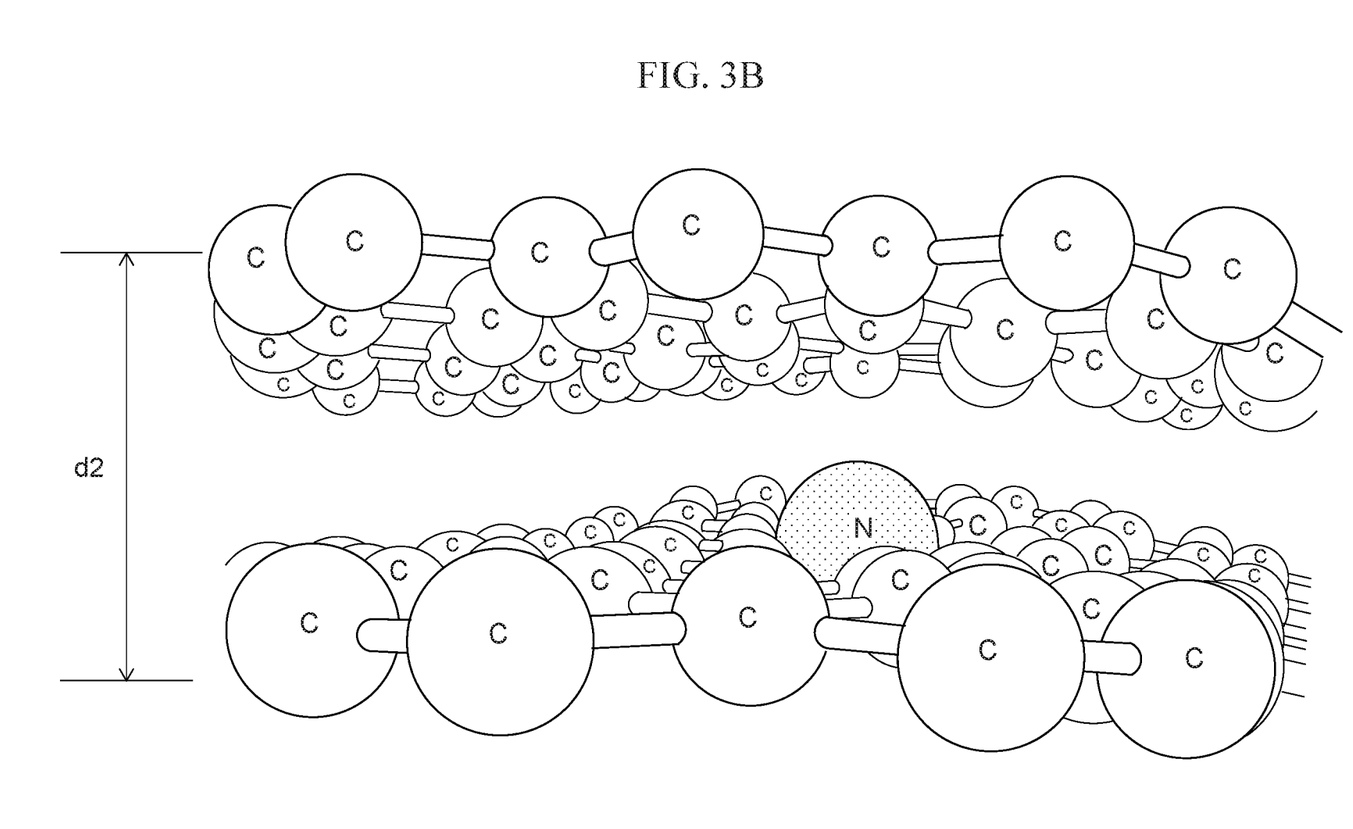
FIG. 3B is a schematic view showing the structures of adjacent graphenes in an amorphous carbon film containing a nitrogen atom with coordination number of 3.

By the way, as shown in FIG. 3A, in an amorphous carbon film not containing nitrogen atoms (N), adjacent graphenes are stacked with a predetermined interlayer distance d1 kept therebetween. Meanwhile, with regard to a nitrogen atom (N) with coordination number of 3, it is known that the position of the nitrogen atom (N) in a graphene is a high such that it is elevated as shown in FIG. 3B. Therefore, as in this embodiment, the interlayer distance d2 between adjacent graphenes in an amorphous carbon film containing nitrogen atoms (N) with coordination number of 3 is longer than the interlayer distance d1 between adjacent graphenes in an amorphous carbon film not containing nitrogen atoms (N) (see FIGS. 3A and 3B). Consequently, since an amorphous carbon film containing nitrogen atoms (N) with coordination number of 3 has a long interlayer distance d2 between adjacent graphenes, the interlayer bonding strength of the adjacent graphenes is week. Thus, an interlayer slip is caused with a low shear force. Accordingly, as the sliding member slides over a counterpart member via graphenes, which are formed in layers and have a small shear force, it is considered that a very small frictional force is exhibited under an environment in which lubricating oil is used.

Figure 4:
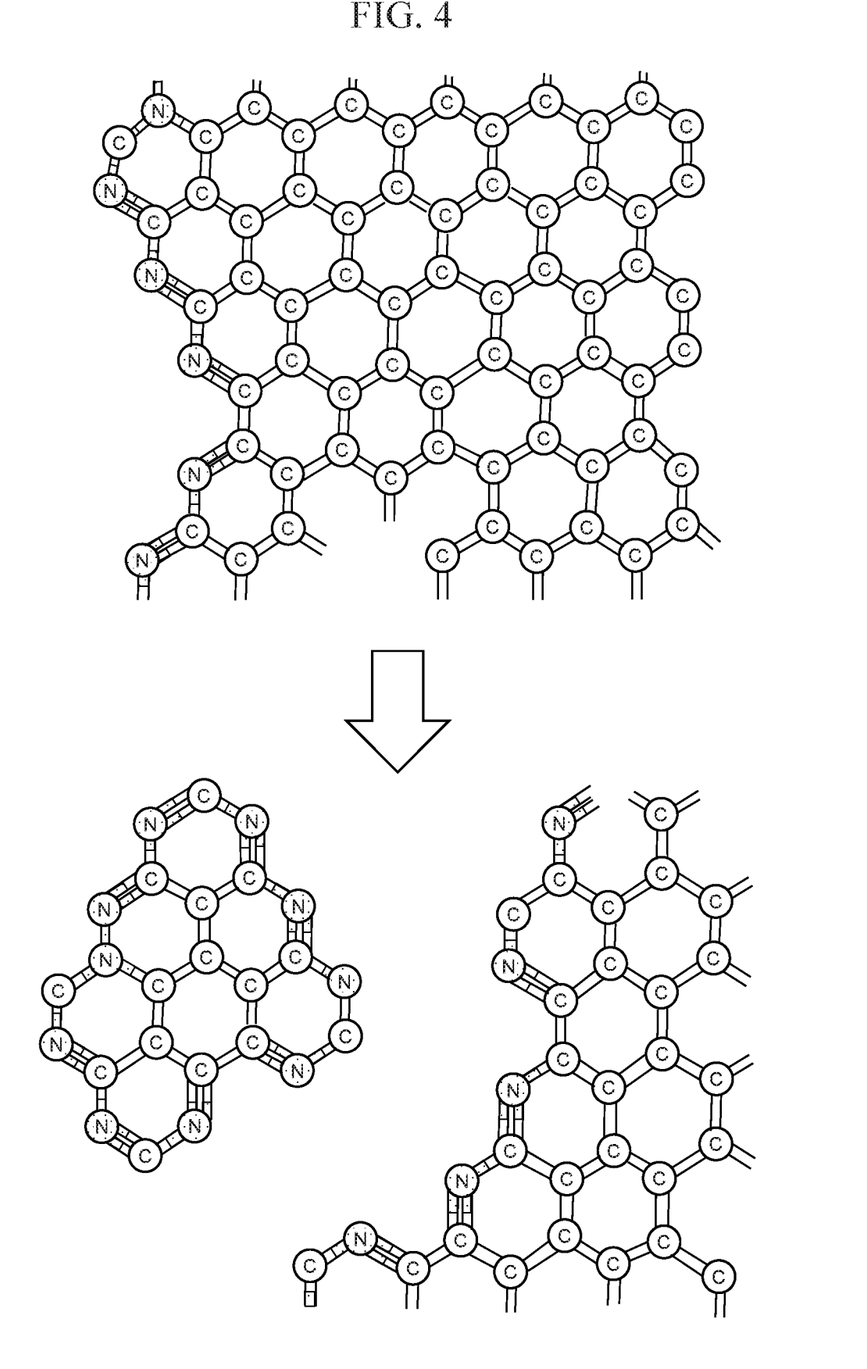
FIG. 4 is a schematic view showing a change in the structure of a graphene when a number of nitrogen atom with coordination number of 2 is increased in an amorphous carbon film.

Meanwhile, as shown in the upper view of FIG. 4, nitrogen atoms (N) with coordination number of 2 are disposed at an end of a graphene sheet. Herein, if the number of nitrogen atoms (N) with coordination number of 2 is increased, the nitrogen atoms (N) with coordination number of 2 will divide the graphene into smaller pieces as shown in the lower view of FIG. 4, and the resulting graphenes will thus become smaller. This, in turn, is estimated to disturb the inherent low shear properties of the graphenes.

From the aforementioned perspective, in this embodiment, the amorphous carbon film 12 is formed by securing a given proportion of nitrogen atoms (N) with coordination number of 3 shown in FIG. 2A while limiting the proportion of nitrogen atoms (N) with coordination number of 2 shown in FIG. 2B.

So far, as disclosed in Patent Document 1, the output power of the electron beams E that irradiate the carbon target T has been several hundreds W. However, in this embodiment, the output power of the electron beams E is in the range of greater than or equal to 30 W and less than or equal to 50 W, which is quite lower than those for the conventional sliding members. Accordingly, it is possible to reduce the energy of electron beams that irradiate the carbon target and limit the proportion of nitrogen atoms with coordination number of 2 while securing a given proportion of nitrogen atoms with coordination number of 3 in comparison with when the conventional sliding members are produced.

Herein, if the output power of the electron beams E that irradiate the carbon target is less than 30 W, the energy introduced into the carbon target T is too small. Therefore, the film hardness of the amorphous carbon film 12 will significantly decrease, and the wear resistance of the amorphous carbon film 12 will thus decrease.

Meanwhile, if the output power of the electron beams F is over 50 W, the proportion of nitrogen atoms with coordination number of 2 becomes high, and thus the number of double bonds between carbon atoms and nitrogen atoms will increase. Therefore, it is considered that the nitrogen atoms with coordination number of 2 will divide the graphene into smaller pieces during film deposition, and thus generate smaller graphenes, which in turn disturbs the inherent low shear properties of the graphenes (see FIG. 4). From such a perspective, the output of the electron beams F that irradiates the carbon target T is more preferably less than or equal to 40 W.

2. Regarding Amorphous Carbon Film 12

With regard to the amorphous carbon film 12 formed under the aforementioned conditions, provided that the number of nitrogen atoms each singly bonded to 3 carbon atoms (nitrogen atoms with coordination number of 3) is A and the number of nitrogen atoms each singly and doubly bonded to two carbon atoms, respectively, (nitrogen atoms with coordination number of 2) is B, the value A/B of the amorphous carbon film 12 obtained through X-ray photoelectron spectroscopy analysis is greater than or equal to 10 and less than or equal to 18.

If such a range is satisfied, the proportion of nitrogen atoms with coordination number of 2 in the amorphous carbon film 12 is limited. Therefore, the amorphous carbon film 12 is estimated to contain larger graphenes. Further, since a given proportion of nitrogen atoms with coordination number of 3 is secured, the interlayer distance between adjacent graphenes can be maintained long. Consequently, when the sliding member is slid with lubricating oil, a lower coefficient of friction than those of the conventional sliding members can be ensured.

Herein, if the value A/B of the amorphous carbon film is less than 10, the proportion of nitrogen atoms with coordination number of 3 becomes small, while the proportion of nitrogen atoms with coordination number of 2 becomes high. Therefore, it is difficult for the resulting sliding member to have a low coefficient of friction. From such a point, the value A/B of the amorphous carbon film is more preferably greater than or equal to 15. Meanwhile, if the value A/B of the amorphous carbon film is over 18, the proportion of nitrogen atoms with coordination number of 3 becomes too high. Therefore, the film hardness of the amorphous carbon film 12 will significantly decrease and the wear resistance thereof will thus decrease.

3. Regarding Method for Measuring Value A/B of Amorphous Carbon Film

The value A/B of the amorphous carbon film obtained through X-ray photoelectron spectroscopy analysis is measured as follows. Specifically, the amorphous carbon film is irradiated with soft X-rays using X-ray photoelectron spectroscopy (XPS), and photoelectrons excited and emitted from the surface of the film are spectrometrically analyzed. Since the photoelectrons have energy values in accordance with the binding energy of electrons, the binding energy of electrons can be determined as long as the energy of X-rays is constant. Accordingly, in the X-ray photoelectron spectroscopy analysis, it is typically possible to obtain information about the electronic state or the chemical-bonding state of atoms existing in the range of several nanometers from the surface.

Figure 5A:
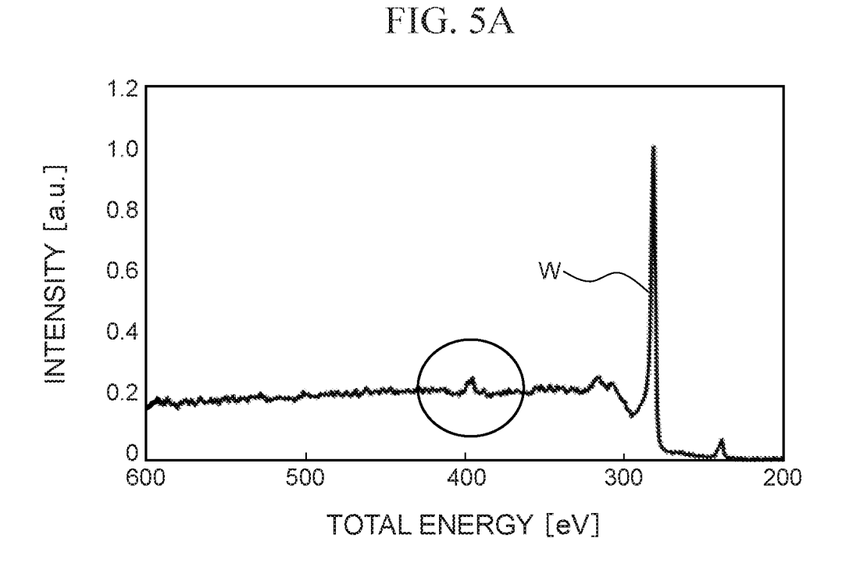
FIG. 5A is a graph showing an exemplary waveform of the relationship between the binding energy and the intensity when an amorphous carbon film is analyzed through X-ray photoelectron spectroscopy.
Figure 5B:
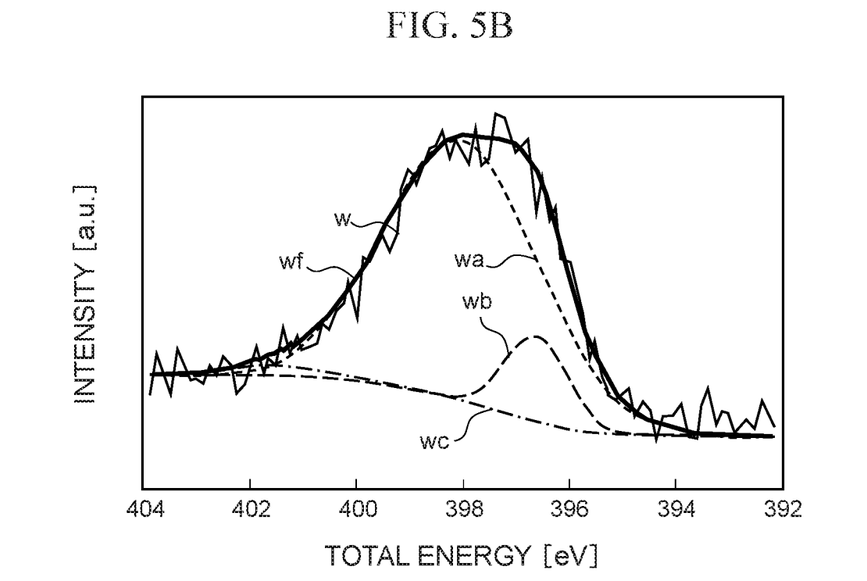
FIG. 5B is a schematic view for illustrating a method for computing the value A/B of an amorphous carbon film from a waveform that is obtained by partially enlarging the waveform shown in FIG. 5A.

Specifically, if the amorphous carbon film is irradiated with soft X-rays in the X-ray photoelectron spectroscopy, a waveform W of the binding energy and intensity can be obtained as shown in FIG. 5A. Next, as shown in FIG. 5B, of the obtained waveforms W, a waveform w with a peak of N1s around a binding energy of 400 eV is extracted and smoothed (fitted), and the resulting waveform wf is separated into three waveforms (wa to wc). That is, the combined waveforms wa to wc correspond to the waveform wf.

As the constraint conditions for performing fitting, the number of peaks of a waveform to be separated is 3, and each peak position is constrained so that the peak position has a value within ±1.0 eV of 401.7 eV, 398.1 eV, or 396.7 eV. Each half-width is constrained so that the half-width is within ±0.5 eV of 1.70 eV, 3.40 eV, or 1.34 eV. Accordingly, of the obtained three waveforms wa to wc, it is possible to obtain the waveform wa whose peak is centered at around 398.1 eV, a waveform wb whose peak is centered at around 396.7 eV, and a waveform we whose peak is centered at around 401.7 eV.

Herein, the peak area of the waveform wa in a section of 392 to 404 eV is computed. The area is a value derived from the number A of nitrogen atoms with coordination number of 3 shown in FIG. 2A. Next, the peak area of the waveform wb in a section of 392 to 404 eV is computed. This area is a value derived from the number B of nitrogen atoms with coordination number of 2 shown in FIG. 2B. Therefore, computing the ratio between the thus computed peak areas (the peak area of the waveform wa/the peak area of the waveform wb) can compute the value A/B of the amorphous carbon film, where the number of nitrogen atoms with coordination number of 3 is A and the number of nitrogen atoms with coordination number of 2 is B. It should be noted that the peak area of the waveform we is a value derived from the bonded structure of the nitrogen atoms.

The sliding member in accordance with this embodiment is preferably applied to an automotive part that is used under an environment in which lubricating oil is used. Examples of such an automotive part include a piston skirt, piston pin, piston ring, cylinder bore, crankshaft, camshaft, roller rocker, valve, stein cap, lash adjuster, and valve lifter.

EXAMPLES

Hereinafter, the present disclosure will be described by way of examples.

Example 1

Production of Sliding Member

An apparatus such as the one shown in FIG. 1 was used to form an amorphous carbon film ($CN_x$ film) containing nitrogen. First, a silicon wafer with a surface with (100) orientation was prepared as the substrate. The substrate and a carbon target were placed in a vacuum chamber, and the air in the chamber was evacuated with a turbo-molecular pump so that the pressure in the chamber became 2.0 to $4.0 \times 10^{-3}$ Pa. Then, cooling water at 20° C. was circulated through an installation base having the substrate placed thereon so that the temperature of the substrate was kept constant.

Next, a nitrogen ion beam generation source was adjusted such that the flow rate of nitrogen gas for generating assisting nitrogen ions in the nitrogen ion generation source became at a rate of 7 sccm, the accelerating voltage of the assisting nitrogen ions became 0.5 kV (10 mA), and the microwave output of the assisting nitrogen ions became 0.5 kW (reflection output: 0.5 kW). The surface of the substrate was irradiated with the thus adjusted nitrogen ion beams so that the surface of the substrate was cleaned for 5 minutes.

Next, the surface of the substrate was irradiated with nitrogen ion beams under the same conditions as the cleaning conditions, and also, the carbon target was irradiated with an electron beams with an output adjusted to 30 W so that a part of the carbon target was melted and evaporated and a part of the evaporated carbon target was vapor-deposited onto the surface of the substrate irradiated with the nitrogen ion beams. The deposition time was 2 minutes and 0 second, and the deposition rate and the film thickness as measured with the film thickness meter were 8.3 nm/s and 1.0 μm, respectively. In this manner, a sliding member having a substrate and an amorphous carbon film ($CN_x$ film), which contains nitrogen, formed on the surface (sliding surface) of the substrate was obtained.

Examples 2 and 3

As in Example 1, a sliding member was produced that has a substrate and an amorphous carbon film formed thereon. Examples 2 and 3 differ from Example 1 in that an output of electron beams irradiating the target was sequentially increased to 40 W and 50 W.

Comparative Examples 1 to 4

As in Example 1, a sliding member was produced that has a substrate and an amorphous carbon film formed thereon. Comparative Examples 1 to 4 differ from Example 1 in that an output of electron beams irradiating the target was sequentially increased to 10 W, 20 W, 60 W, and 63 W.

Comparative Example 5

A sliding member was prepared that has an amorphous carbon film (DLC film), which does not contain hydrogen, formed using electron beam vapor deposition.

Comparative Example 6

A sliding member was prepared that has a substrate and an amorphous carbon film (DLC film), which contains hydrogen and does not contain nitrogen, formed on the surface of the substrate using PVD.

Comparative Example 7

A sliding member was prepared that has a film of amorphous carbon (DLC film), which does not contain nitrogen, formed using arc ion plating (ATP).

Hardness Test

The film hardness of the amorphous carbon film of the sliding member in accordance with each of Examples 1 to 3 and Comparative Examples 1 to 4 was measured. Specifically, a load displacement curve when the indentation hardness of the surface of the amorphous carbon film was measured using an AFM nanoindenter produced by Hysitron was determined, and the projected area of the identation produced through plastic deformation was computed from the load displacement curve. Then, the maximum indentation load was divided by the projected area of the identation so as to compute the film hardness. Table 1 shows the results.

TABLE 1

|  | Electron Beam Power [W] | Film Hardness [GPa] | Depth of Wear [μm] | A/B | Coefficient of Friction | Content of Nitrogen Atoms [at %] |
|---|---|---|---|---|---|---|
| Comparative Example 1 | 10 | 10.2 | 1.3 | 20 | 0.13 | 2.4 |
| Comparative Example 2 | 20 | 10.8 | 1.1 | 19 | 0.12 | 2.7 |
| Example 1 | 30 | 12.7 | 0.5 | 18 | 0.004 | 1.6 |
| Example 2 | 40 | 12.8 | 0.55 | 15 | 0.02 | 3.1 |
| Example 3 | 50 | 12.5 | 0.4 | 10 | 0.04 | 2.6 |
| Comparative Example 3 | 60 | 12.6 | 0.4 | 7.5 | 0.053 | 3.6 |
| Comparative Example 4 | 63 | 12.7 | 0.5 | 6 | 0.122 | 3.7 |

Block-On-Ring Friction and Wear Test

Figure 6A:
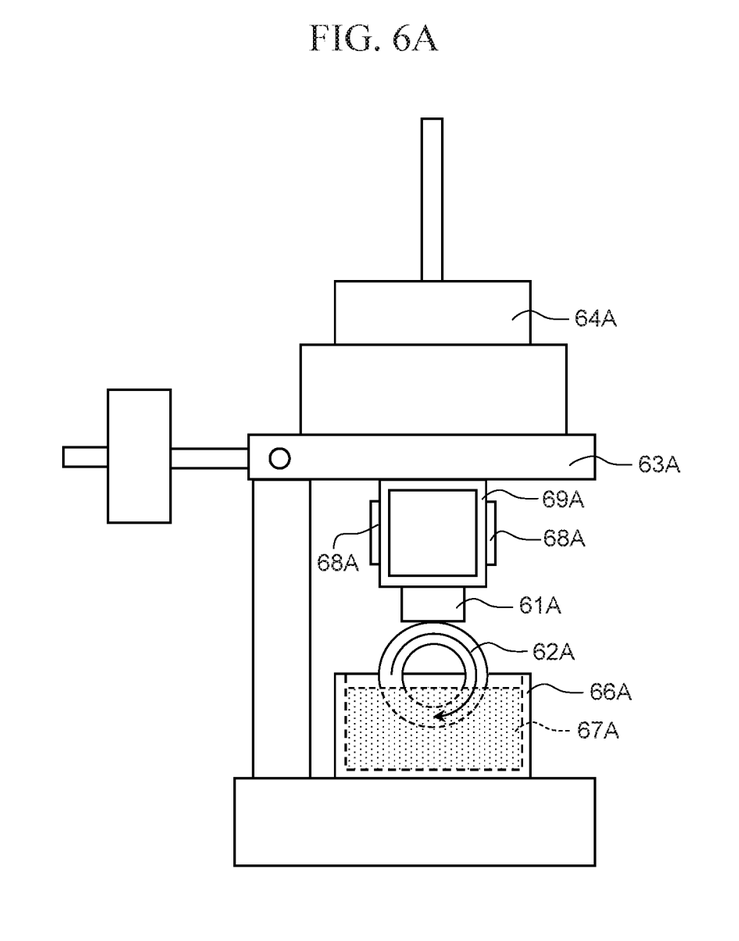
FIG. 6A is a schematic side view for illustrating a block-on-ring friction and wear test machine.

A block-on-ring friction and wear test was conducted using a test machine shown in FIG. 6A. Specifically, a block test piece 61A to become the sliding member in accordance with each of Examples 1 to 3 and Comparative Examples 1 to 4 was prepared. As shown in FIG. 6A, a ring test piece (JIS standard: SUJ2) 62A was prepared, and the block test piece 61A was placed thereon. Using a weight 64A with a leveler 63A interposed therebetween, a vertical load was applied to the peripheral surface of the ring test piece 62A and the surface of the block test piece 61A along the vertical direction.

Figure 7:
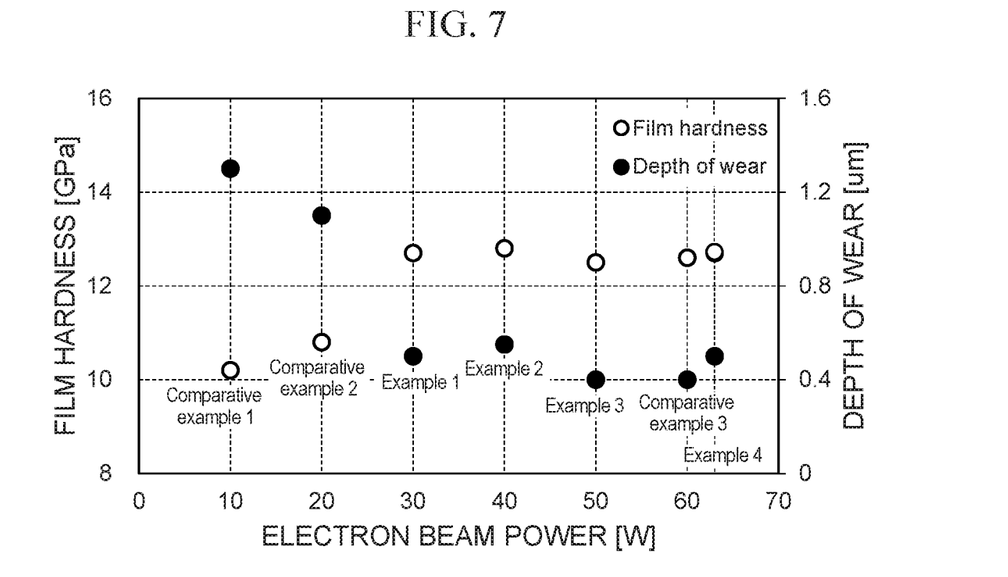
FIG. 7 is a graph showing the relationship among the electron beam power (output) during deposition of an amorphous carbon film of a sliding member in accordance with each of Examples 1 to 3 and Comparative Examples 1 to 4, the film hardness of the amorphous carbon film, and the depth of wear thereof.

In such a state, a part of the ring test piece 62A was immersed in lubricating oil 67A (base oil used for engine oil (PAO4: polyalphaolefin)) in an oil bath tank 66A so that the ring test piece 62A was slid over the block test piece 61A while the ring test piece 62A was rotated. The vertical load was set to 294 N by two strain gauges 68A attached to a support member 69A that supports the block test piece 61A, and the ring test piece was rotated at a slip velocity of 160 rpm under a room temperature environment (23° C.) so as to measure the depth of wear of the block test piece 61A. Table 1 shows the results. In addition, FIG. 7 shows the relationship among the electron beam power (output) during deposition of the amorphous carbon film of the sliding member in accordance with each of Examples 1 to 3 and Comparative Examples 1 to 4, the film hardness of the amorphous carbon film, and the depth of wear thereof.

Figure 8:
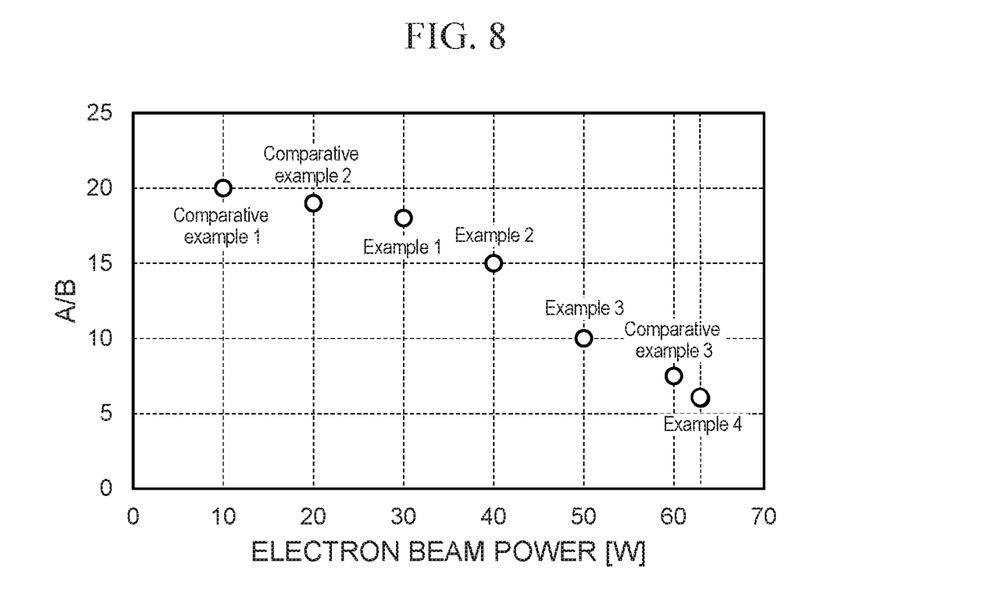
FIG. 8 is a graph showing the relationship between the electron beam power (output) during deposition of an amorphous carbon film of a sliding member in accordance with each of Examples 1 to 3 and Comparative Examples 1 to 4 and the value A/B.

Measurement of Value A/B of Amorphous Carbon Film Analyzed Through X-Ray Photoelectron Spectroscopy The value A/B of the amorphous carbon film of the sliding member in accordance with each of Examples 1 to 3 and Comparative Examples 1 to 4 was measured using the method described with reference to FIGS. 5A and FIG. 5B. Table 1 shows the results. In addition, FIG. 8 shows the relationship between the electron beam power (output) during deposition of the amorphous carbon film of the sliding member in accordance with each of Examples 1 to 3 and Comparative Examples 1 to 4 and the value A/B.

Ball-On-Disk Friction and Wear Test

Figure 6B:
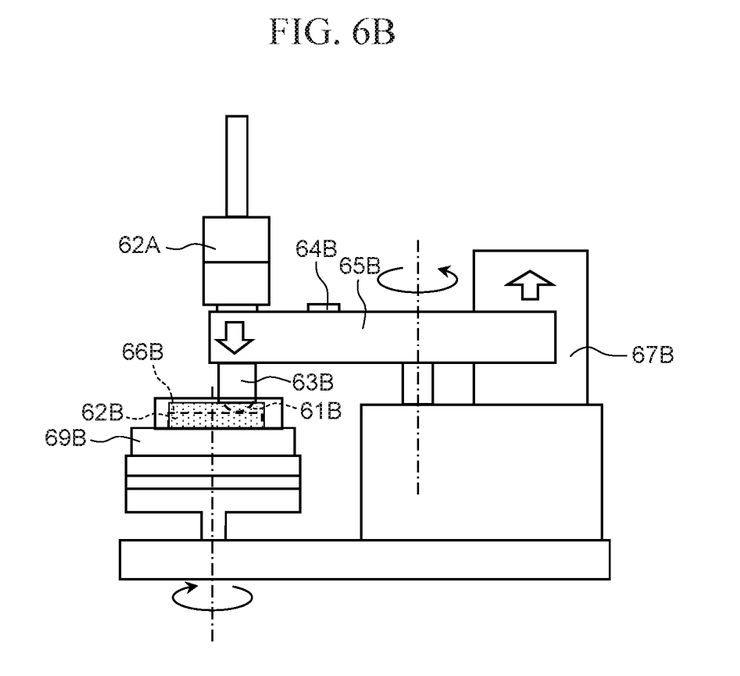
FIG. 6B is a schematic side view for illustrating a ball-on-disk friction and wear test machine.

A ball-on-disk friction and wear test was conducted using a test machine shown in FIG. 6B. Specifically, a ball test piece 61B to become the sliding member in accordance with each of Examples 1 to 3 and Comparative Examples 1 to 7, and a disk test piece 62B were prepared. Specifically, amorphous carbon films corresponding to Examples 1 to 3 and Comparative Examples 1 to 7 were each formed on the surface of a sphere made of bearing steel (SUJ2: JIS standard) with a diameter of 8 mm and the surface of a disk made of bearing steel (SUJ2: JIS standard)) that slides over the surface of the sphere.

Next, as shown in FIG. 6B, the ball test piece 61B fixed to a ball holder 63B was fixed to a beam 65B having a strain gauge 64B attached thereto. The disk test piece 62B was immersed in lubricating oil 66B (PAO4) and the beam 65B was moved in the vertical direction so that an end of the ball test piece 61B was allowed to contact the surface of the disk test piece 62B fixed on a rotating stage 69B, and a vertical load was thus applied thereto. It should be noted that the test was conducted with a vertical load of 0.3 N (a maximum Hertz contact pressure of about 320 MPa) and a slip velocity of 15.7 m/s, and under a room temperature environment (23° C.) in which lubricating oil 66B (PAO4) was present on the sliding surface. The frictional force at that time was measured using a load cell 67B, and the frictional force was divided by the vertical load so as to compute the coefficient of friction of the sliding member in accordance with each of Examples 1 to 3 and Comparative Examples 1 to 7.

Among the coefficients of friction, Table 1 shows the value of the coefficient of friction of each of Examples 1 to 3 and Comparative Examples 1 to 4 in which the electron beam power was changed during deposition of an amorphous carbon film containing nitrogen (CNx film). The coefficient of friction shown in Table 1 is the value of the coefficient of friction in the 500-th cycle of repeated frictions provided that the number of rotation of the disk test piece 62B is the number of repeated friction.

Figure 9:
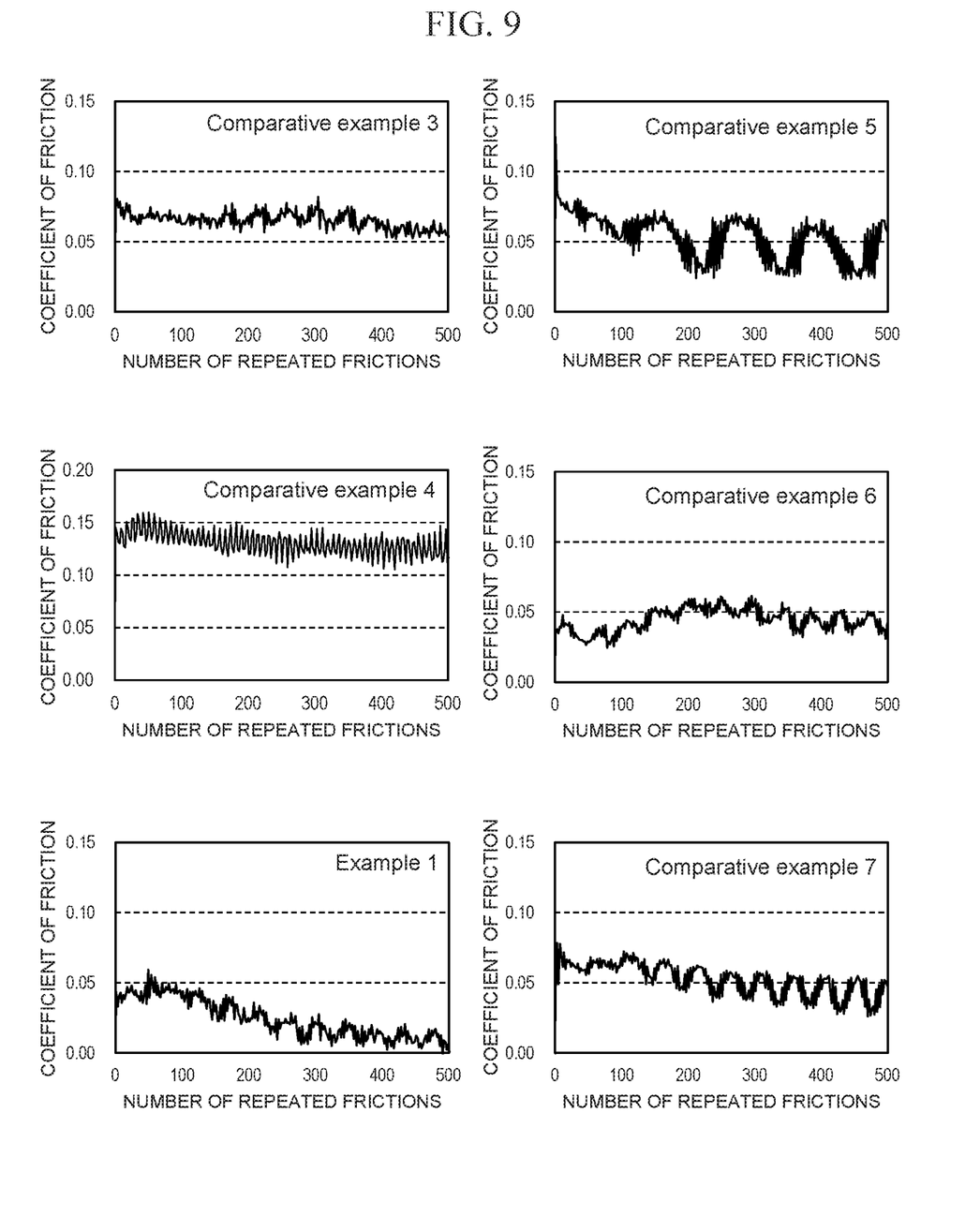
FIG. 9 is a graph showing a waveform of the coefficient of friction of a sliding member in accordance with each of Example 1 and Comparative Examples 3 to 7.
Figure 10:
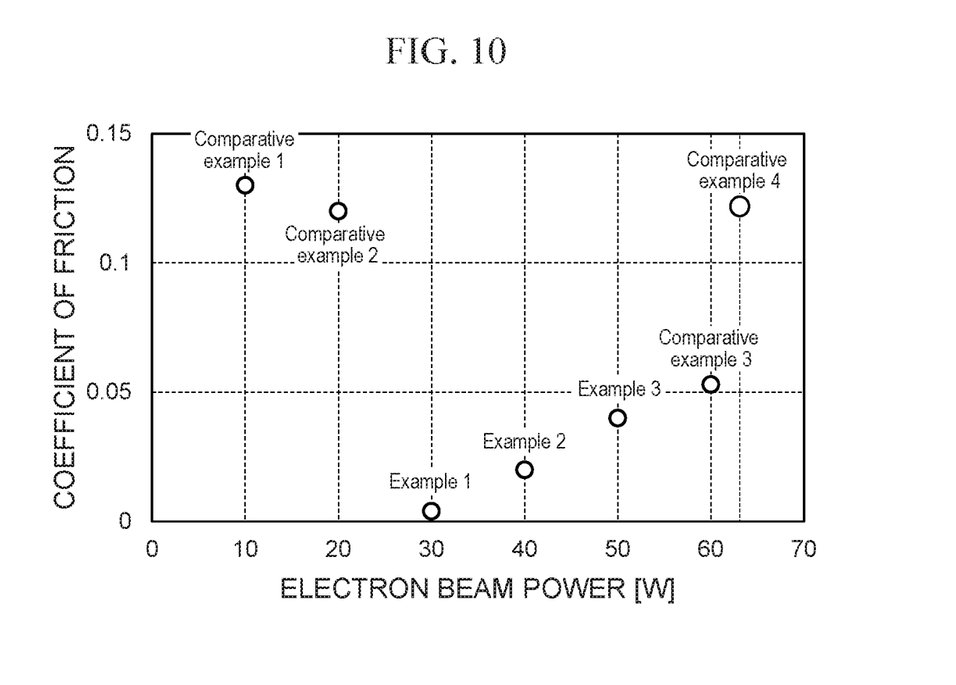
FIG. 10 is a graph showing the relationship between the electron beam power (output) during deposition of an amorphous carbon film of a sliding member in accordance with each of Examples 1 to 3 and Comparative Examples 1 to 4 and the coefficient of friction of the sliding member.
Figure 11:
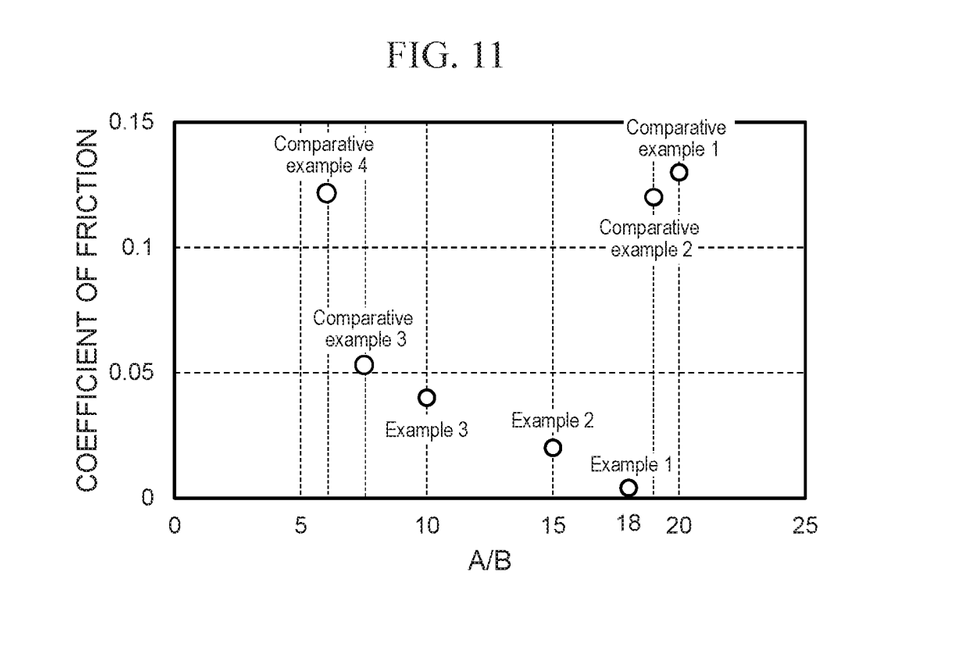
FIG. 11 is a graph showing the relationship between the value A/B of an amorphous carbon film of a sliding member in accordance with each of Examples 1 to 3 and Comparative Examples 1 to 4 and the coefficient of friction of the sliding member.

FIG. 9 shows a waveform of the coefficient of friction of the sliding member in accordance with each of Example 1 and Comparative Examples 3 to 7. FIG. 10 shows the relationship between the electron beam power (output) during deposition of the amorphous carbon film of the sliding member in accordance with each of Examples 1 to 3 and Comparative Examples 1 to 4 and the coefficient of friction of the sliding member. FIG. 11 shows the relationship between the value A/B of the amorphous carbon film of the sliding member in accordance with each of Examples 1 to 3 and Comparative Examples 1 to 4 and the coefficient of friction of the sliding member.

Measurement of Content of Nitrogen Atoms

The content of nitrogen atoms in the amorphous carbon film of the sliding member in accordance with each of Examples 1 to 3 and Comparative Examples 1 to 4 was measured using the aforementioned X-ray photoelectron spectroscopic analyzer. Table 1 shows the results.

(Result 1: Relationship Between Film Hardness and Electron Beam Power)

As shown in Table 1 and FIG. 7, the film hardness of an amorphous carbon film to be deposited increases with an increase in the electron beam power in the range of 10 to 30 W during deposition of the amorphous carbon film. In addition, it is found that the film hardness is about 13 GPa at an electron beam power of greater than or equal to 30 W.

That is, in Comparative Examples 1 and 2 in which the electron beam power is IOW and 20 W, respectively, the electron beam power during film deposition is not sufficient. Therefore, carbon atoms to be vapor-deposited as an amorphous carbon film do not collide with the substrate with a sufficient energy. Therefore, it is considered that the film hardness of the amorphous carbon film of each of Comparative Examples 1 and 2 is not sufficient and the value of the depth of wear is greater than those of the other examples. Accordingly, the electron beam power (output) during deposition of an amorphous carbon film of a sliding member is greater than or equal to 30 W.

(Result 2: Relationship Between an Electron Beam and A/B)

As shown in Table 1 and FIG. 8, the value A/B of the amorphous carbon film decreases with an increase in the electron beam power. This is considered to be due to the reason that the ion energy of carbon increased with an increase in the electron beam power, and the number of double bonds between nitrogen atoms and carbon atoms was thus increased, that is, the number of nitrogen atoms with coordination number of 2 was increased.

(Result 3: Relationship Regarding the Coefficient of Friction)

As shown in FIG. 9, the coefficient of friction of the sliding member in accordance with each of Example 1 and Comparative Examples 3 to 7 decreases with the passage of sliding time (with an increase in the number of repeated friction) due to the habituation effect. In particular, referring to the coefficient of friction of the sliding member in accordance with Example 1, the coefficient of friction is as low as less than or equal to 0.01 in the 500-th cycle of repeated friction. However, it is found that in each of Comparative Examples 3 and 4 in which the electron beam power was outside the range of the present disclosure and Comparative Examples 5 to 7 in which other deposition methods were used, the coefficient of friction is higher than that of Example 1.

(Result 4: Relationship Between Electron Beam Power and Coefficient of Friction, and Relationship Between Value A/B the Coefficient of Friction)

As shown in FIG. 10, referring to Examples 1 to 3, the coefficients of friction of the sliding members are lower than those of the other examples when the electron beam power during film deposition is in the range of 30 to 50 W. This is considered to be due to the reason that in each of Comparative Example 1 (10 W) and Comparative Example 2 (20 W) in which the electron beam power during film deposition is less than 30 W, the film strength is low, and thus that the coefficient of friction has increased due to the wear of the amorphous carbon film. Therefore, as described above, the electron beam power during film deposition needs to be greater than or equal to 30 W, and the value A/B of an amorphous carbon film that is deposited to satisfy such a range is less than or equal to 18 (see FIG. 11).

Meanwhile, as shown in FIG. 10, referring to each of Comparative Example 3 (60 W) and Comparative Example 4 (63 W) in which the electron beam power during film deposition is over 50 W, the ion energy of carbon becomes higher with an increase in the electron beam power. Accordingly, the number of double bonds between carbon and hydrogen in the amorphous carbon film is increased, and thus the number of nitrogen atoms with coordination number of 2 is increased. Consequently, it is considered that as described with reference to FIG. 4 and the like, smaller graphenes are generated, thus disturbing the inherent low shear properties of the graphenes, and thus the coefficient of friction of the sliding member in accordance with each of Comparative Examples 3 and 4 has become higher than those of Examples 1 to 3. Therefore, the electron beam power during film deposition needs to be less than or equal to 50 W, and the value A/B of an amorphous carbon film that is deposited to satisfy such a range is greater than or equal to 10 (see FIG. 11).

Herein, the coefficient of friction of the sliding member in accordance with Example 2 is lower than that of Example 3. This is said to be due to the reason that the number of nitrogen atoms with coordination number of 2 in the amorphous carbon film of the sliding member in accordance with Comparative Example 2 is limited in comparison with that of Example 3. Therefore, the electron beam power during film deposition is preferably less than or equal to 40 W, and the value A/B of an amorphous carbon film that is deposited to satisfy such a range is greater than or equal to 15 (see FIG. 11).

Accordingly, in order for a sliding member to obtain stable wear resistance and low friction property, the electron beam power (output) during film deposition is set to 30 to 50 W, or preferably, 30 to 40 W. The corresponding value A/B of the amorphous carbon film is 10 to 18, or preferably, 15 to 18. A sliding member having such an amorphous carbon film deposited thereon can ensure a lower coefficient of friction than those of the conventional sliding members in an environment in which lubricating oil is used. This is considered to be due to the reason that nitrogen atoms enter the basal surfaces of graphites, thereby increasing the gaps between the basal surfaces of the graphites, and the shearing resistance thus becomes low.

Although the embodiments and examples of the present disclosure have been described in detail above, a specific structure of the present disclosure is not limited to the embodiments or examples. Any design changes that may occur within the spirit and scope of the present disclosure are all included in the present disclosure.

What is claimed is:

1. A sliding member adapted to be slid with lubricating oil, the sliding member comprising:
    a substrate; and
    an amorphous carbon film formed on a surface of the substrate, the amorphous carbon film containing nitrogen atoms,
    wherein:
    provided that a number of nitrogen atoms each singly bonded to three carbon atoms is A, and a number of nitrogen atoms each singly and doubly bonded to two carbon atoms, respectively, is B, a value A/B of the amorphous carbon film is greater than or equal to 10 and less than or equal to 18, the value A/B being obtained by computing, from a waveform of a relationship between a binding energy and an intensity obtained when the amorphous carbon film is analyzed through X-ray photoelectron spectroscopy, a peak area of a waveform wa derived from the number A of nitrogen atoms, and a peak area of a waveform wb derived from the number B of nitrogen atoms, and computing a ratio of the peak area of the waveform wa to the peak area of the waveform wb.

2. A method for producing the sliding member adapted to be slid with lubricating oil according to claim 1, the method comprising:
    irradiating the surface of the substrate with nitrogen ion beams and irradiating a carbon target with electron beams, thereby forming the amorphous carbon film on the surface of the substrate while vapor-depositing a part of the carbon target onto the surface of the substrate,
    wherein:
    an output of the electron beams that irradiate the carbon target is greater than or equal to 30 W and less than or equal to 50 W.

\* \* \* \* \*